United States Patent
Otani et al.

(10) Patent No.: US 9,426,570 B2
(45) Date of Patent: Aug. 23, 2016

(54) AUDIO PROCESSING DEVICE AND METHOD

(71) Applicant: FUJITSU LIMITED, Kawasaki-shi, Kanagawa (JP)

(72) Inventors: Takeshi Otani, Kawasaki (JP); Taro Togawa, Kawasaki (JP); Chisato Ishikawa, Kawasaki (JP); Masanao Suzuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 155 days.

(21) Appl. No.: 14/080,373

(22) Filed: Nov. 14, 2013

(65) Prior Publication Data

US 2014/0153743 A1 Jun. 5, 2014

(30) Foreign Application Priority Data

Dec. 3, 2012 (JP) .................................. 2012-264650

(51) Int. Cl.
*H04B 15/00* (2006.01)
*H04R 3/04* (2006.01)
(Continued)

(52) U.S. Cl.
CPC .............. *H04R 3/04* (2013.01); *G10L 21/0208* (2013.01); *H03G 5/18* (2013.01); *H04R 3/007* (2013.01); *H04R 2430/01* (2013.01); *H04R 2499/11* (2013.01)

(58) Field of Classification Search
CPC ................. G10L 21/0208; G10L 2021/02082; H03G 5/18
USPC ....................... 381/94.1–94.3, 95–96; 700/94; 704/226, 233
See application file for complete search history.

(56) References Cited

U.S. PATENT DOCUMENTS 5,930,372 A * 7/1999 Kuriyama .............. G06F 1/1626
381/71.14
5,999,906 A * 12/1999 Mercs ............... G11B 20/10527
704/270

(Continued)

FOREIGN PATENT DOCUMENTS

EP 0284077 9/1988
JP H08-317490 11/1996

(Continued)

OTHER PUBLICATIONS

Agerkvist Finn T et al: "Subjective Test of Class D Amplifiers Without Output Filter", AES Convention 117; Oct. 2004, AES, 60 East 42nd Street, Room 2520 New York 10165-2520, USA, Oct. 1, 2004, Section 2.1.

(Continued)

*Primary Examiner* — Disler Paul
(74) *Attorney, Agent, or Firm* — Fujitsu Patent Center

(57) ABSTRACT

An audio processing device includes a setting section that sets a reproduction sampling frequency $F_{play}$ and a recording sampling frequency $F_{rec}$ higher than $F_{play}$, a digital-to-analog converter that based on $F_{play}$ converts a sound source signal that is a digital signal into a reproduction signal that is an analog signal, an analog-to-digital converter that based on $F_{rec}$ converts a recording signal that is an analog signal converter into an input signal that is a digital signal, a signal separator that separates the input signal into a low region signal contained in a band of less than $F_{play}$ and a high region signal contained in a band of the $F_{play}$ and higher, and a breakup detector that detects whether or not breakup is occurring in the reproduced sound based on power of the high region signal.

21 Claims, 12 Drawing Sheets

(51) Int. Cl.
 *H03G 5/18* (2006.01)
 *G10L 21/0208* (2013.01)
 *H04R 3/00* (2006.01)

(56) References Cited

U.S. PATENT DOCUMENTS

| | | | |
|---|---|---|---|
| 6,925,340 B1 * | 8/2005 | Suito | G10L 21/04 386/350 |
| 6,965,804 B1 * | 11/2005 | Mercs | G11B 20/10527 381/119 |
| 2005/0089148 A1 * | 4/2005 | Stokes, III | H04M 9/082 379/3 |
| 2012/0106750 A1 | 5/2012 | Thormundsson et al. | |
| 2012/0143360 A1 * | 6/2012 | Henneberg | H04H 60/04 700/94 |
| 2015/0078562 A1 * | 3/2015 | Shanmugasundaram | G11B 27/005 381/61 |

FOREIGN PATENT DOCUMENTS

JP 2006-5902 1/2006
JP 2011-79389 4/2011

OTHER PUBLICATIONS

EESR—Extended European Search Report of European Patent Application No. 13193278.2 dated Jun. 9, 2016.

* cited by examiner

| Fs[ j ] | SAMPLING FREQUENCY |
|---|---|
| Fs[ 0 ] | 8kHz |
| Fs[ 1 ] | 11.25kHz |
| Fs[ 2 ] | 16kHz |
| Fs[ 3 ] | 22.5kHz |
| Fs[ 4 ] | 32kHz |
| Fs[ 5 ] | 44.1kHz |
| Fs[ 6 ] | 48kHz |
| Fs[ 7 ] | 96kHz |

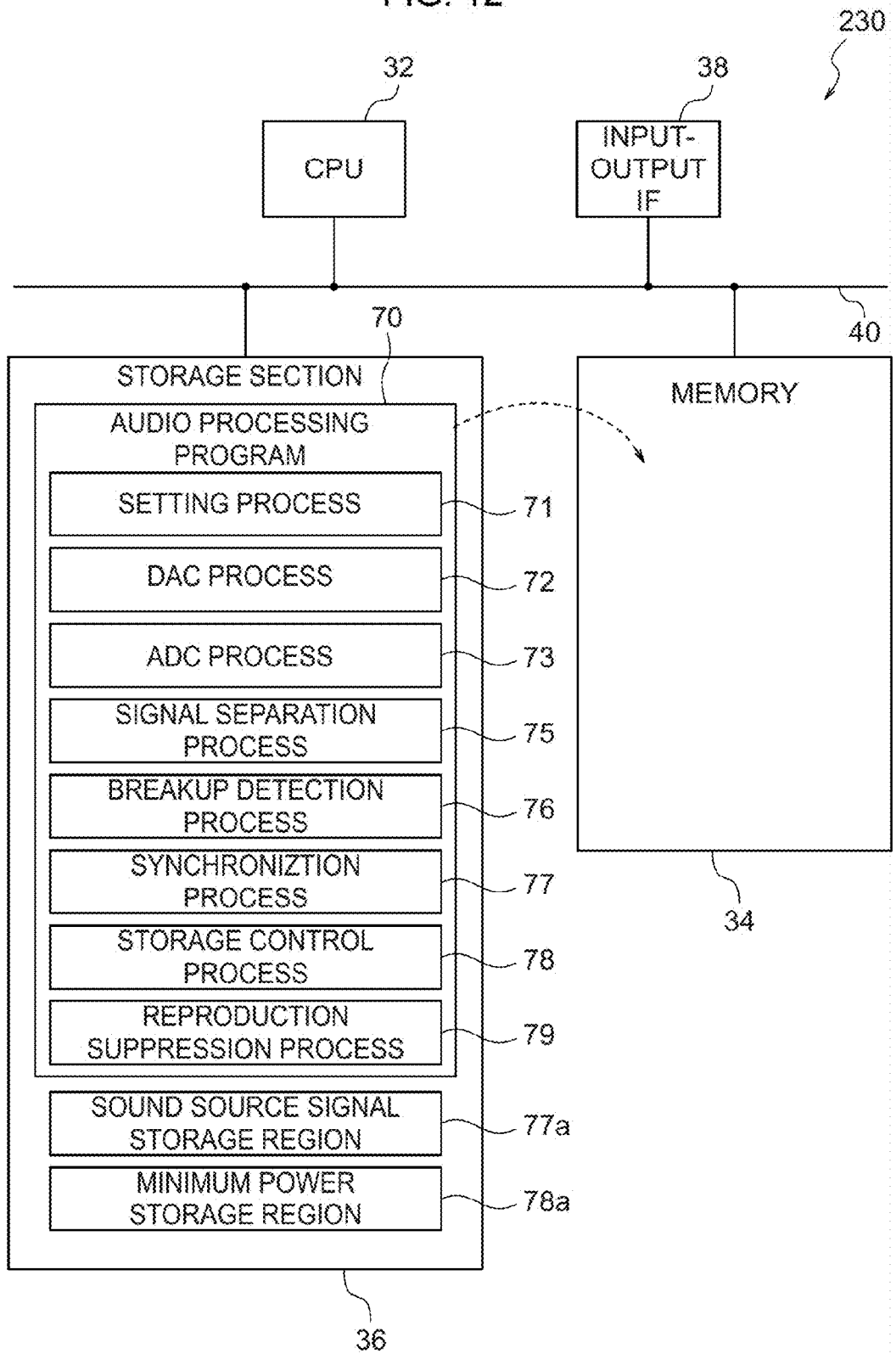

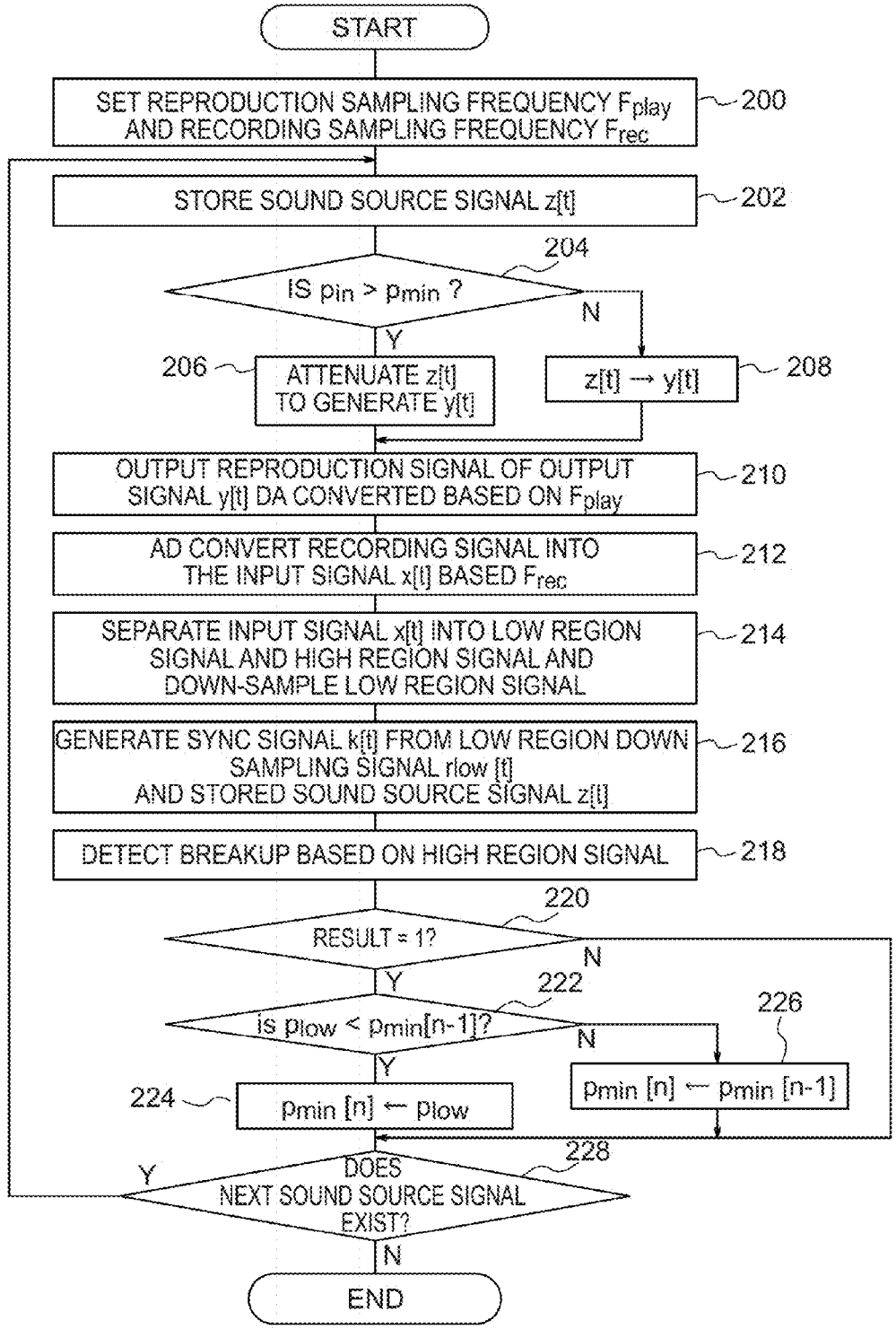

AUDIO PROCESSING DEVICE AND METHOD

CROSS-REFERENCE TO RELATED APPLICATION

This application is based upon and claims the benefit of priority of the prior Japanese Patent Application No. 2012-264650, filed on Dec. 3, 2012, the entire contents of which are incorporated herein by reference.

FIELD

The embodiments discussed herein are related to an audio processing device, an audio processing method, and an audio processing program.

BACKGROUND

Along with recent trends to more compact and thinner portable devices such as mobile phones, reproduction devices installed in mobile phones are getting thinner. However, there is an increasing demand for high volume sound reproduction as the usage of mobile phones diversifies into usages such as for listening to music and watching videos. Vibrations of reproduction devices are, however, transferred to cases of mobile phones due to reproduction of speech at high volume with small reproduction devices, with this leading to breakup (crackling noise) in the reproduced sound. The sound quality of reproduced sound deteriorates when breakup occurs often, and for example spoken voices become hard to catch with mobile phones.

There is accordingly a proposal for a crackling noise prevention method to prevent crackling noise generated within a vehicle due to low frequency sound signals contained in audio signals. In such a crackling noise prevention method, a low frequency crackling test signal is broadcast into a vehicle by reproduction with a speaker, and the crackling noise that is generated within the vehicle is collected by a microphone provided inside the vehicle. Then a fluctuation signal of amplitude fluctuations in the crackling noise signal generated by vibration in resonance with the low frequency signal is detected by the microphone collected signal, and the characteristics of low frequencies of a frequency characteristic adjuster (equalizer) input with the audio signal are controlled such that the fluctuation amount of the fluctuation signal achieves a set value or lower.

RELATED PATENT DOCUMENTS

Japanese Laid-Open Patent Publication No. 2011-79389

SUMMARY

According to an aspect of the embodiments, an audio processing device includes: a setting section that sets a reproduction sampling frequency and a recording sampling frequency higher than the reproduction sampling frequency; a digital-to-analogue converter that, based on the reproduction sampling frequency, converts a sound source signal that is a digital signal into a reproduction signal that is an analogue signal; an analogue-to-digital converter, that based on the recording sampling frequency, converts a recording signal that is an analogue signal obtained by recording sound that has been reproduced according to the reproduction signal converted by the digital-to-analogue converter into an input signal that is a digital signal; a signal separator that separates the input signal converted by the analogue-to-digital converter into a low region signal contained in a band of less than the reproduction sampling frequency and a high region signal contained in a band of the reproduction sampling frequency and higher; and a breakup detector that detects whether or not breakup is occurring in the reproduced sound based on power of the high region signal, or based on a difference or ratio between power of the high region signal and power of the low region signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 is a schematic block diagram illustrating an example of a computer that functions as an audio processing device according to the second exemplary embodiment; and FIG. 13 is a flow chart illustrating audio processing in the second exemplary embodiment.

DESCRIPTION OF EMBODIMENTS

Detailed explanation follows regarding an exemplary embodiment of technology disclosed herein, with reference to the drawings.

First Exemplary Embodiment

Figure 1:
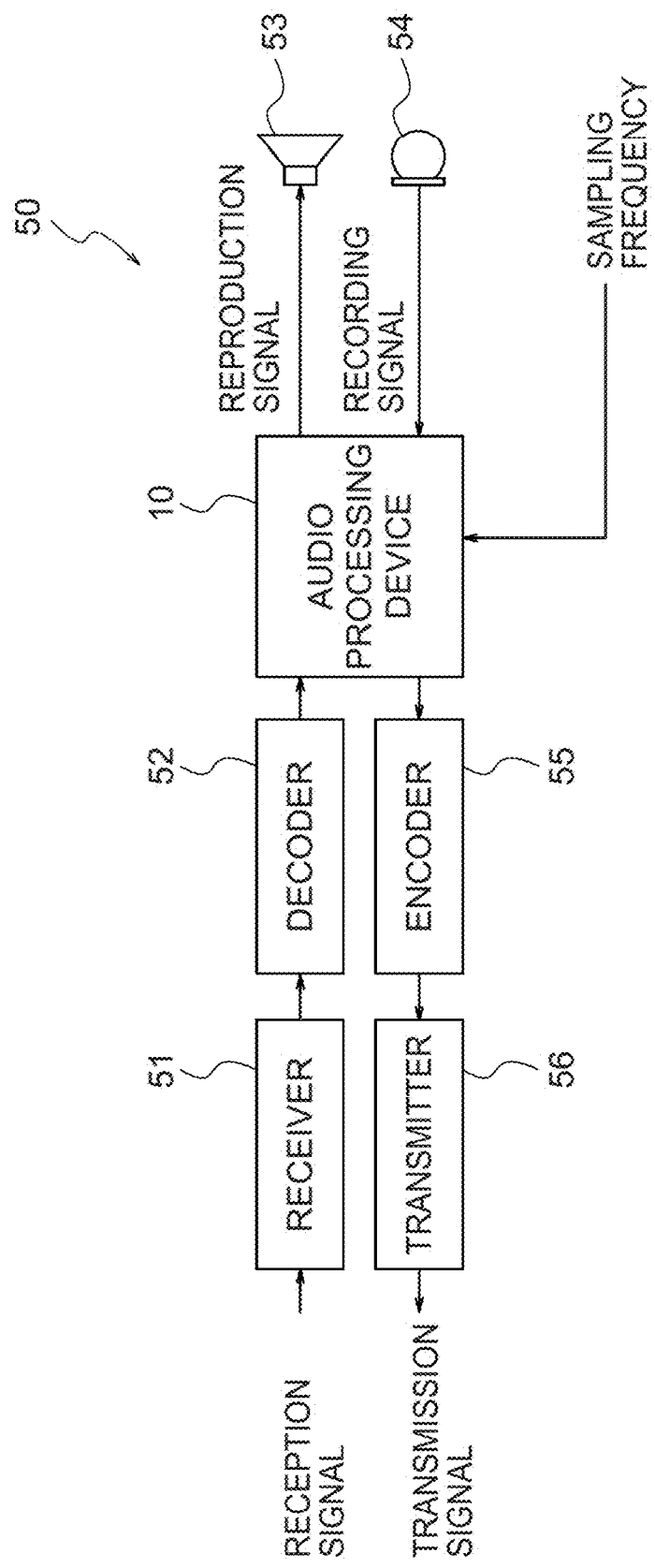
FIG. 1 is a functional block diagram illustrating an example of a mobile phone installed with an audio processing device according to a first exemplary embodiment.

Explanation follows regarding, as illustrated in FIG. 1, an example of the technology disclosed herein applied to an audio processing device 10 that is installed in a mobile phone 50, detects breakup during talking and suppresses breakup.

As illustrated in FIG. 1, the audio processing device 10 is input with a reception signal received by a receiver 51 and decoded by a decoder 52. The reception signal input to the audio processing device 10 is an example of a source signal of technology disclosed herein. The reception signal input to the audio processing device 10 is audio processed by the audio processing device 10, output as a reproduction signal, and output as reproduced sound from a speaker 53. The reproduced sound output from the speaker 53 according to the reproduction signal is collected by a microphone 54 and input as a recording signal to the audio processing device 10. The recording signal input to the audio processing device 10 is audio processed and output by the audio processing device 10. The output recording signal is encoded in an encoder 55 into a transmission signal and transmitted by a transmitter 56.

Figure 2:
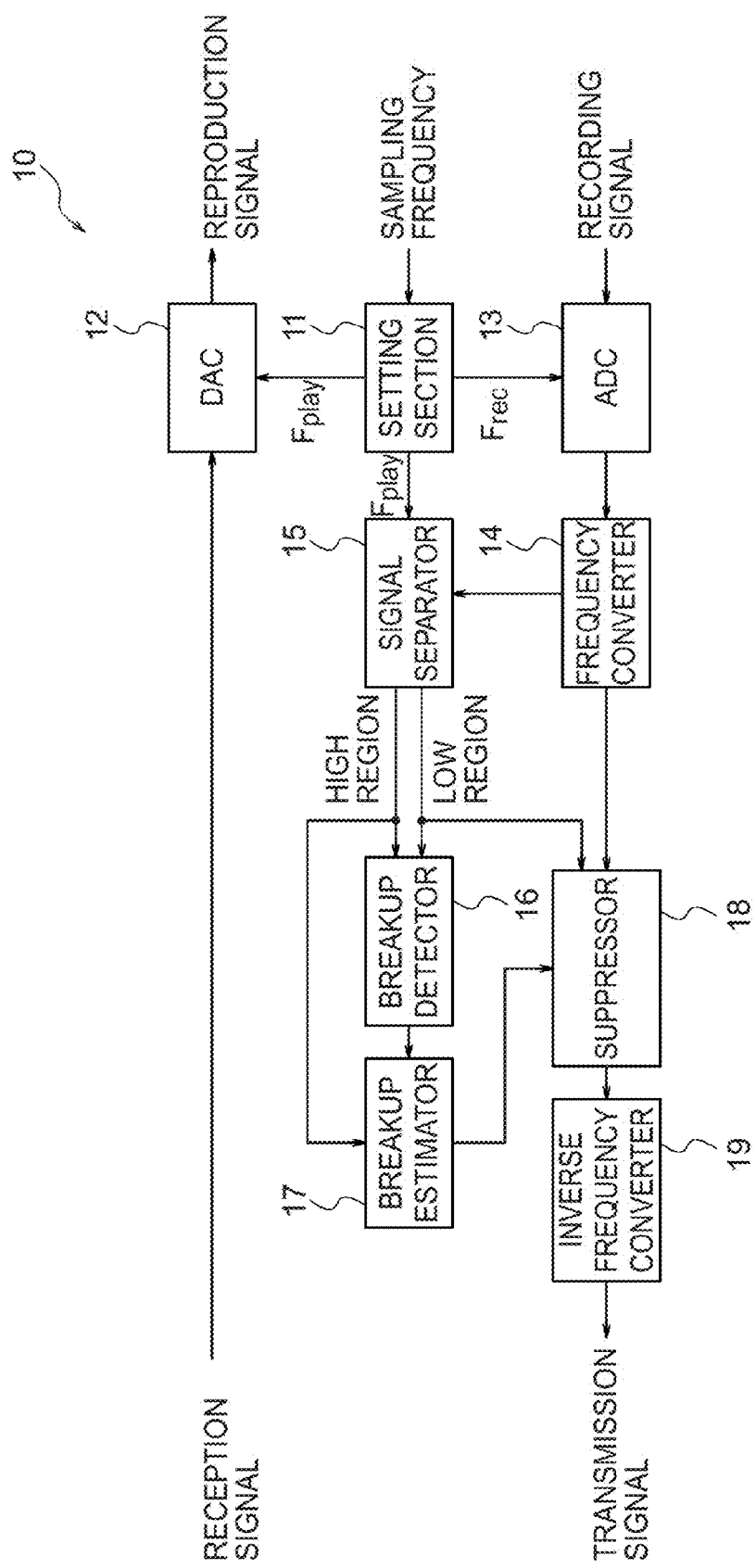
FIG. 2 is a functional block diagram illustrating an example of an audio processing device according to the first exemplary embodiment.

FIG. 2 illustrates the audio processing device 10 according to a first exemplary embodiment. The audio processing device 10 includes a setting section 11, a digital-to-analogue converter (DAC) 12, an analogue-to-digital converter (ADC) 13, a frequency converter 14, a signal separator 15, a breakup detector 16, a breakup estimator 17, a suppressor 18 and an inverse frequency converter 19.

The setting section 11 sets a reproduction sampling frequency $F_{play}$ in the DAC 12 and a recording sampling frequency $F_{rec}$ in the ADC 13 based on the input sampling frequency Fs.

Figure 3:
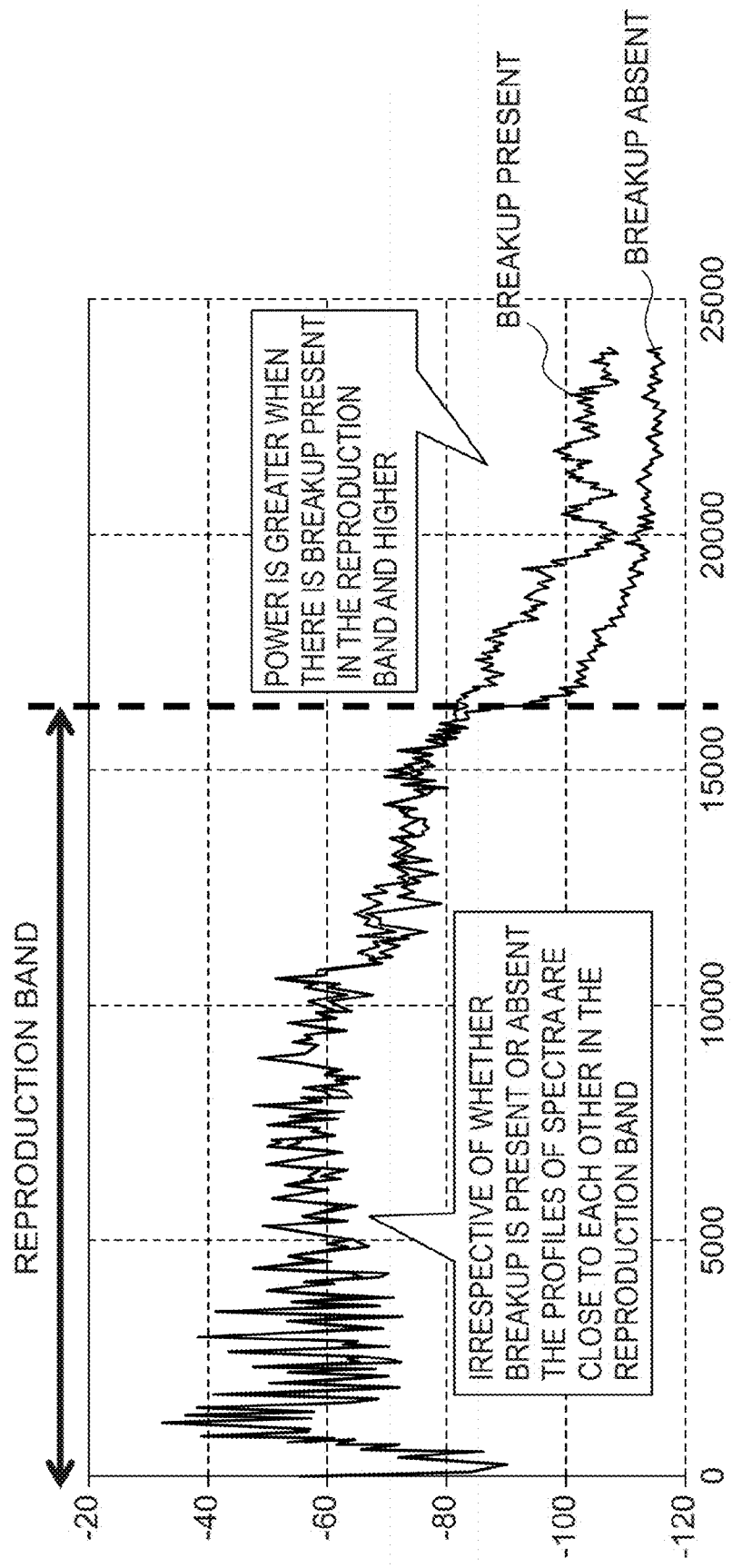
FIG. 3 is a diagram illustrating an example of frequency spectra comparing the presence and absence of breakup.

FIG. 3 illustrates frequency spectra during breakup (in the presence of breakup) and during non-breakup (in the absence of breakup) when reproduced sound output from the speaker 53 is recorded at a sampling frequency of 32 kHz. As illustrated in FIG. 3, in a reproduction band less than the Nyquist frequency (half the sampling frequency) (low region) the spectrum with breakup present is close to the profile of the spectrum in which breakup is absent, and it is difficult to discriminate between the two spectra. However, due to a breakup component occurring across the entire respectively region in a band of the reproduction band and higher (high region), the power in the presence of breakup is greater than the power in the absence of breakup. In other words, the difference or the ratio between the power in the low region and the power in the high region is smaller when breakup is present than when breakup is absent.

Figure 4:
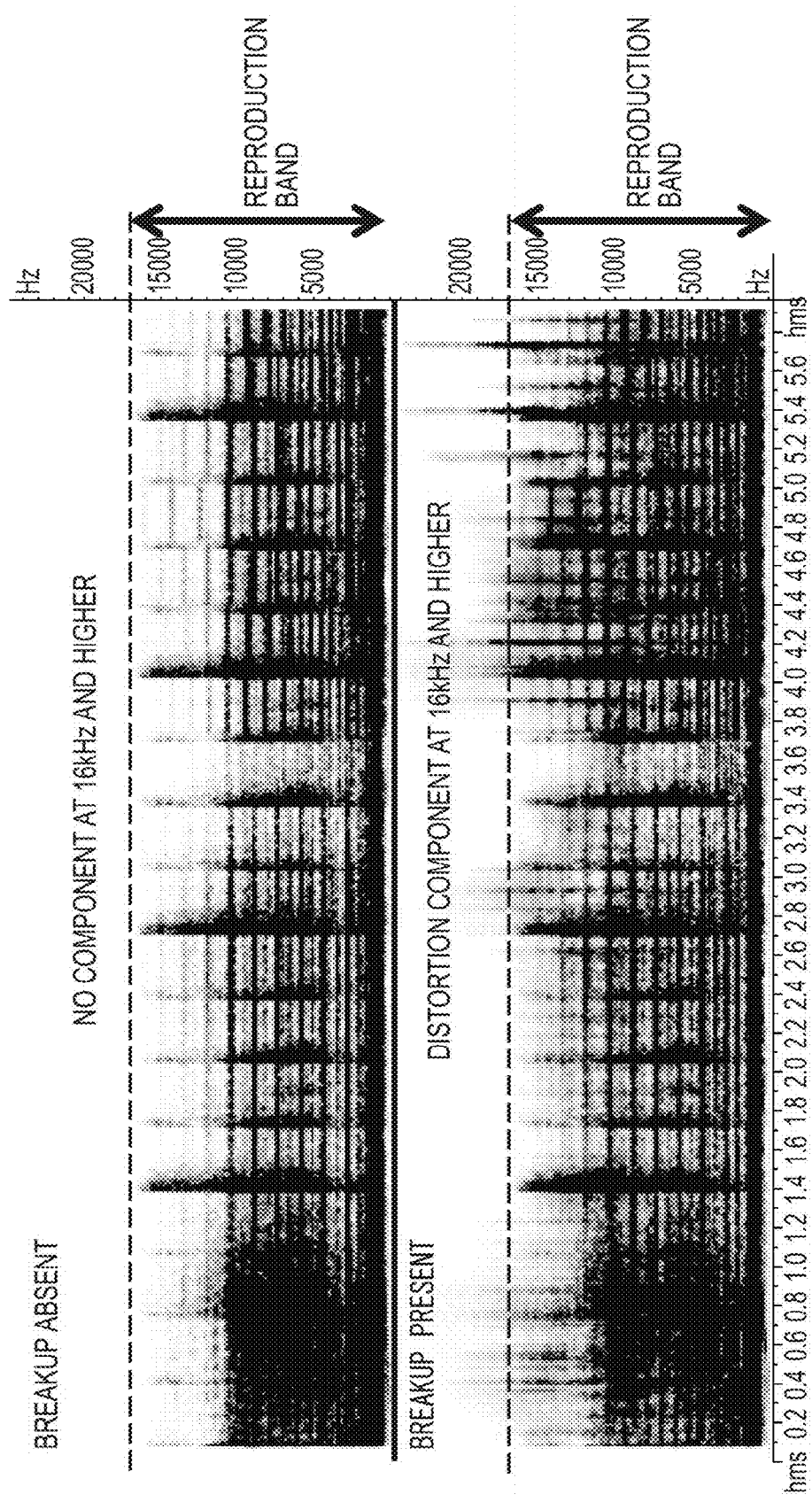
FIG. 4 is a diagram illustrating spectrograms comparing the presence and absence of breakup.

FIG. 4 illustrates spectrograms of reproduced sound output from the speaker 53 recorded at a sampling frequency of 32 kHz with breakup and without breakup. In FIG. 4, the horizontal axis is time and the vertical axis is frequency, and the power intensity of each frequency band is represented by the shading density. As illustrated in FIG. 4, there are no components present in a band of the reproduction band and higher when breakup is absent, however a distortion component occurs in the band of the reproduction band and higher when breakup is present.

It is consequently possible to detect whether or not breakup is occurring during reproduction of the reproduction signal based on a signal of a high region of a recording signal of the reproduced sound output from the speaker 53 and collected by the microphone 54, or based on a comparison between a low region signal and a high region signal thereof.

Thus in order to acquire a signal of a signal band in the reproduction signal of the reproduction band and higher, the setting section 11 sets the recording sampling frequency $F_{rec}$ for the recording signal higher than the reproduction sampling frequency $F_{play}$. In the first exemplary embodiment, as an example, the reproduction sampling frequency $F_{play}$ and the recording sampling frequency $F_{rec}$ are set according to following Equation (1).

$$F_{play}=Fs, F_{rec}=Fs \times 2 \tag{1}$$

The DAC 12 converts the reception signal that is a digital signal into a reproduction signal that is an analogue signal based on the reproduction sampling frequency $F_{play}$ set by the setting section 11.

The ADC 13 converts the recording signal that is an analogue signal to an input signal x[t] that is a digital signal based on the recording sampling frequency $F_{rec}$ set by the setting section 11, and outputs the converted signal to the frequency converter 14. Note that t is the time.

The frequency converter 14 uses a Fast Fourier Transform (FFT) to convert the input signal x[t] that is a time domain signal converted by the ADC 13 into an input spectrum X[f] that is a frequency domain signal, and outputs the input spectrum X[f] to the suppressor 18. Note that f is the frequency. The number of FFT points is F. The frequency converter 14 computes the power spectrum P[f] from the input spectrum X[f] according to the following Equation (2), and outputs the power spectrum P[f] to the signal separator 15.

$$P[f]=10 \cdot \log_{10}|X[f]|^2 \tag{2}$$

The signal separator 15 separates the power spectrum P[f] computed by the frequency converter 14 into a low region spectrum and a high region spectrum based on the reproduction sampling frequency $F_{play}$ set by the setting section 11. The spectrum of a band less than the reproduction sampling frequency $F_{play}$ is the low region spectrum, and the spectrum of a band of the reproduction sampling frequency $F_{play}$ and higher is the high region spectrum. In the first exemplary embodiment, due to setting $F_{play}=F_{rec}/2$, separation is made into the low region spectrum of 0 to F/2 and the high region spectrum of F/2 to F. The signal separator 15 outputs the low region spectrum to the breakup detector 16 and the suppressor 18 and outputs the high region spectrum to the breakup detector 16 and the breakup estimator 17.

The breakup detector 16 uses the low region spectrum and the high region spectrum input from the signal separator 15 to compute a power difference between the low region power and the high region power. The power difference diff may be computed for example according to the following Equation (3).

$$diff = \sum_{f=F/2}^{F} P[f] - \sum_{f=0}^{F/2} P[f] \tag{3}$$

The breakup detector 16 detects breakup based on the computed power difference diff. The difference between the low region power and the high region power is, as described above, smaller when breakup is present than when breakup is absent. The breakup detector 16 therefore, as expressed by following Equation (4), outputs a breakup detection result=1 to indicate the presence of breakup when the power difference diff is less than a predetermined threshold value THR. However the breakup detector 16 outputs a breakup detection result=0 to indicate the absence of breakup when the power difference diff is the threshold value THR or greater.

$$result = \begin{cases} 1 & \text{if}(diff < THR) \\ 0 & \text{else} \end{cases} \tag{4}$$

When breakup is detected by the breakup detector 16, the breakup estimator 17 estimates the breakup spectrum R[f] in the low region based on the high region spectrum input from the signal separator 15. The breakup spectrum R[f] is estimated for example according the following Equation (5). α[f] is a weighting coefficient for each band.

$$R[f] = \alpha[f] \cdot \left( \sum_{f=F/2}^{F} P[f] \right) \quad (5)$$

$$f = 0 \sim F/2$$

Figure 5:
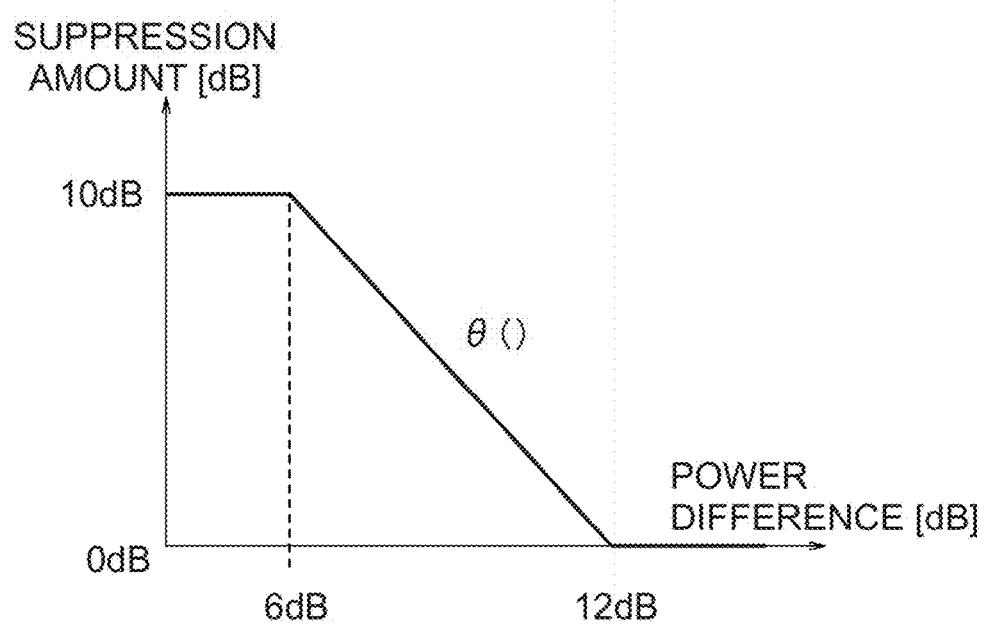
FIG. 5 is a graph illustrating an example of a transform $\theta$ for computing gain.

The suppressor 18 computes the gain G[f] for suppressing the input signal based on the breakup spectrum R[f] estimated by the breakup estimator 17. For example, as expressed by following Equation (6), the gain G[f] is computed based on the power difference (P[f]−R[f]) between the estimated breakup spectrum R[f] and the power spectrum P[f] input from the signal separator 15.

$$G[f] = 10^{\frac{\theta(P[f]-R[f])}{20}} \quad (6)$$

$$f = 0 \sim F/2$$

Wherein θ( ) is a transform from power difference (P[f]−R[f]) to gain G[f]. As the the power difference (P[f]−R[f]) gets smaller this indicates a better match of the low region spectrum to the breakup spectrum. Therefore, as illustrated in FIG. 5, the transform θ( ) can be determined to make the gain G[f] smaller the larger the power difference (P[f]−R[f]).

Moreover, as represented by the following Equation (7), the suppressor 18 multiplies the computed gain G[f] by the low region component of the input spectrum X[f] input from the frequency converter 14 to compute the output spectrum Y[f], which is then output to the inverse frequency converter 19.

$$Y[f] = G[f] \cdot X[f] \, f = 0 \text{ to } F/2 \quad (7)$$

The inverse frequency converter 19 uses an Inverse Fast Fourier Transform (IFFT) to convert the output spectrum Y[f] that is the frequency domain signal input from the suppressor 18 into a transmission signal y[t] that is a time domain signal. Note that the number of IFFT points is $F_{play}/F_{rec}$ (in this case ½) times the number of FFT points F in the frequency converter 14.

Figure 6:
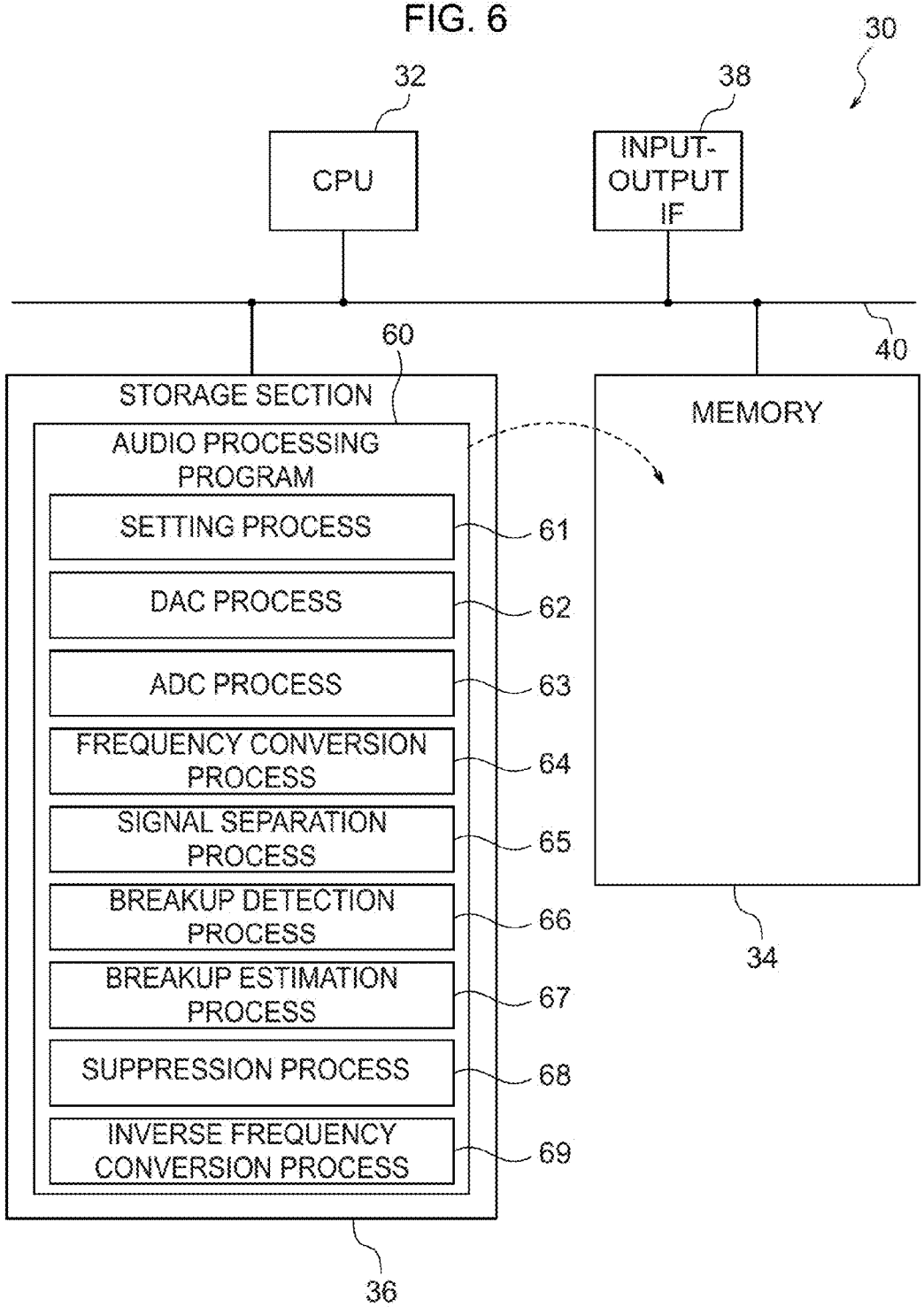
FIG. 6 is a schematic block diagram illustrating an example of a computer that functions as an audio processing device according to the first exemplary embodiment.

It is possible to implement the audio processing device 10 with for example a computer 30 as illustrated in FIG. 6. The computer 30 includes a CPU 32, a memory 34, a non-volatile storage section 36, and an input-output interface (IF) 38. The CPU 32, the memory 34, the storage section 36 and the input-output IF 38 are connected to each other through a bus 40. The speaker 53 and the microphone 54 are connected to the input-output IF 38.

The storage section 36 can be implemented for example by a Hard Disk Drive (HDD) or flash memory. The storage section 36 serving as a storage medium is stored with an audio processing program 60 for causing the computer 30 to function as the audio processing device 10. The CPU 32 reads the audio processing program 60 from the storage section 36, expands the audio processing program 60 into the memory 34, and sequentially executes processes of the audio processing program 60.

The audio processing program 60 includes a setting process 61, a DAC process 62, an ADC process 63, a frequency conversion process 64, a signal separation process 65, a breakup detection process 66, a breakup estimation process 67, a suppression process 68 and an inverse frequency conversion process 69.

The CPU 32 operates as the setting section 11 illustrated in FIG. 2 by executing the setting process 61. The CPU 32 operates as the DAC 12 illustrated in FIG. 2 by executing the DAC process 62. The CPU 32 operates as the ADC 13 illustrated in FIG. 2 by executing the ADC process 63. The CPU 32 operates as the frequency converter 14 illustrated in FIG. 2 by executing the frequency conversion process 64. The CPU 32 operates as the signal separator 15 illustrated in FIG. 2 by executing the signal separation process 65. The CPU 32 operates as the breakup detector 16 illustrated in FIG. 2 by executing the breakup detection process 66. The CPU 32 operates as the breakup estimator 17 illustrated in FIG. 2 by executing the breakup estimation process 67. The CPU 32 operates as the suppressor 18 illustrated in FIG. 2 by executing the suppression process 68. The CPU 32 operates as the inverse frequency converter 19 illustrated in FIG. 2 by executing the inverse frequency conversion process 69. The computer 30 executing the audio processing program 60 accordingly functions as the audio processing device 10.

Note that it is possible to implement the audio processing device 10 with, for example, a semiconductor integrated circuit, and more particularly with an Application Specific Integrated Circuit (ASIC) or the like.

Explanation next follows regarding operation of the first exemplary embodiment. When speaking processing is started in the mobile phone 50, the CPU 32 first expands the audio processing program 60 stored in the storage section 36 into the memory 34 and then executes the audio processing illustrated in FIG. 7.

Figure 7:
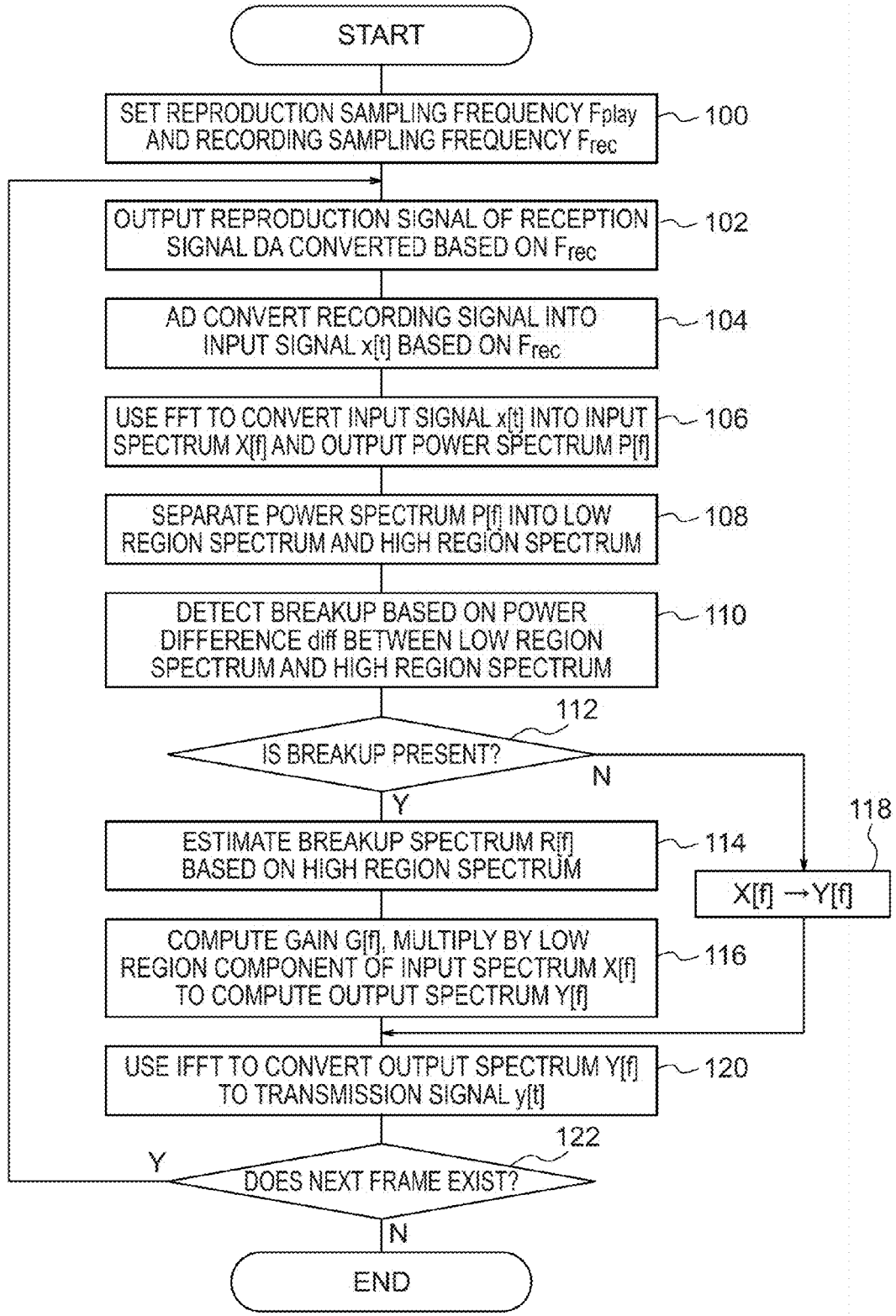
FIG. 7 is a flow chart illustrating audio processing in the first exemplary embodiment.

At step 100 of the audio processing illustrated in FIG. 7, the setting section 11 sets the reproduction sampling frequency $F_{play}$ in the DAC 12 and the recording sampling frequency $F_{rec}$ in the ADC 13 based on the input sampling frequency Fs. The setting section 11 sets the reproduction sampling frequency $F_{play}$ and the recording sampling frequency $F_{rec}$ such that the $F_{play} < F_{rec}$, for example as expressed by Equation (1).

Next at step 102, the DAC 12 acquires 1 frames worth of the reception signal received by the receiver 51 and decoded by the decoder 52. Based on the reproduction sampling frequency $F_{play}$ set at step 100, the DAC 12 coverts the reception signal that is a digital signal to the reproduction signal that is an analogue signal and outputs the reproduction signal. The output reproduction signal is output as reproduced sound from the speaker 53.

Next at step 104, the ADC 13 acquires 1 frames worth of the recording signal collected by the microphone 54. The ADC 13 then converts the recording signal that is an analogue signal into the input signal x[t] that is a digital signal based on the recording sampling frequency $F_{rec}$ set at step 100.

Next at step 106, the frequency converter 14 uses a FFT to convert the input signal x[t] that is a time domain signal converted into a digital signal at step 104 into an input spectrum X[f] that is a frequency domain signal. The frequency converter 14 also computes the power spectrum P[f] from the input spectrum X[f].

Next at step 108, the signal separator 15 separates the power spectrum P[f] computed at step 106 into the low region spectrum and the high region spectrum based on the reproduction sampling frequency $F_{play}$ set at step 100.

Next at step 110, the breakup detector 16 uses the low region spectrum and the high region spectrum separated at step 108 to compute the power difference diff between the low region power and the high region power. Then the breakup detector 16 outputs the breakup detection result=1 to indicate the presence of breakup when the computed power difference diff is less than the predetermined threshold value THR. However, the breakup detector 16 outputs the breakup detection result=0 to indicate the absence of breakup when the power difference diff is the threshold value THR or greater.

Next at step 112, the breakup estimator 17 determines whether or not breakup was detected at step 110. Presence of breakup is determined and processing proceeds to step 114 when the breakup detection result output from the breakup detector 16 is 1. However, absence of breakup is determined and processing proceeds to step 118 when the breakup detection result is 0.

At step 114, the breakup estimator 17 estimates the breakup spectrum R[f] in the low region for example according to Equation (5) based on the high region spectrum separated at step 108.

Then at step 116, the suppressor 18 computes the gain G[f] based on the power difference (P[f]−R[f]) between the breakup spectrum R[f] estimated at step 114 and the power spectrum P[f] separated at step 108. Then the suppressor 18 multiplies the computed gain G[f] by the low region component of the input spectrum X[f] converted at step 106 to compute the output spectrum Y[f], and processing proceeds to step 120.

At step 118, the suppressor 18 takes the low region component of the input spectrum X[f] converted at step 106 as the output spectrum Y[f] without modification, and processing proceeds to step 120.

At step 120, the inverse frequency converter 19 uses a IFFT to convert the output spectrum Y[f] that is a frequency domain signal into the transmission signal y[t] that is a time domain signal. The converted transmission signal y[t] is then encoded by the encoder 55 and transmitted by the transmitter 56.

Next at step 122, determination is made as to whether or not a reception signal and recording signal exist for the next frame. A reception signal and a recording signal exist for the next frame when the talking processing of the mobile phone 50 continues, and so processing returns to step 102, and the processing of steps 102 to 120 is repeated. However, no reception signal or recording signal exists for the next frame when the talking processing has finished and so the audio processing is ended.

As explained above, according to the audio processing device 10 of the first exemplary embodiment, during talking with a mobile phone, a recording signal collected by the microphone is converted into an input signal using a higher recording sampling frequency than the reproduction sampling frequency when converting the reception signal into a reproduction signal. Breakup is then detected based on the power difference between a low region less than the reproduction sampling frequency and a high region of the reproduction sampling frequency and higher in the input signal. The input signal is suppressed and transmitted when breakup is detected. Consequently, breakup during talking can be detected, namely during reception signal reproduction, without the need for prior calibration using a test signal.

Second Exemplary Embodiment

Figure 8:
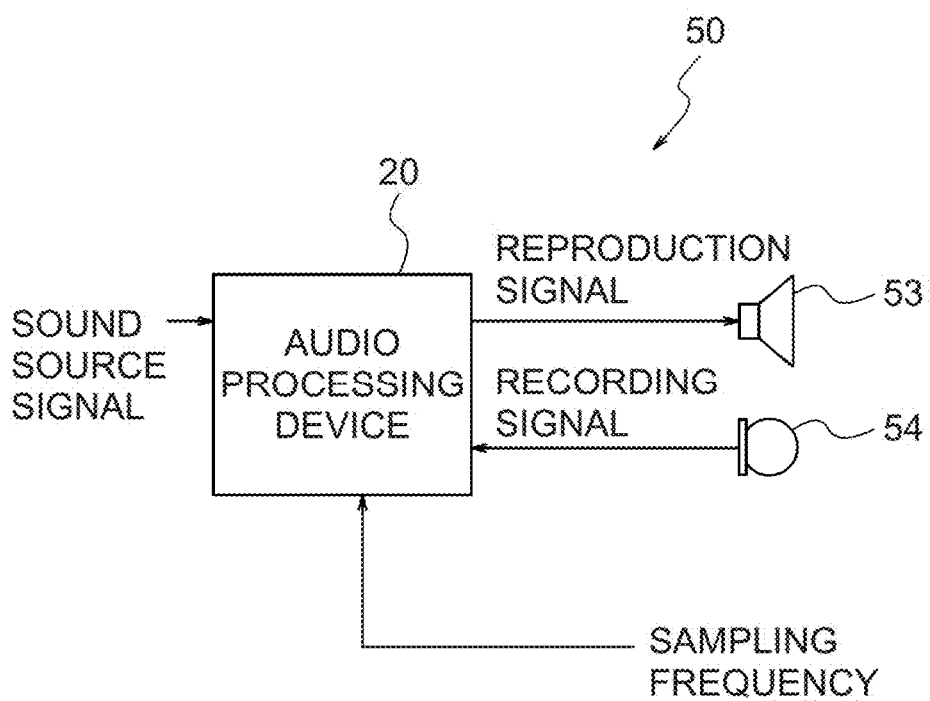
FIG. 8 is a functional block diagram illustrating an example of a mobile phone installed with an audio processing device according to a second exemplary embodiment.

In the second exemplary embodiment, as illustrated in FIG. 8, explanation follows regarding an example in which the technology disclosed herein is applied to an audio processing device 20 that is installed to a mobile phone 50 and detects breakup and prevents breakup during reproduction of a sound source signal stored in a storage region in the mobile phone 50.

As illustrated in FIG. 8, the sound source signal stored in the storage region inside the mobile phone 50 is read and input to the audio processing device 20. The sound source signal input to the audio processing device 20 is audio processed by the audio processing device 20, output as a reproduction signal, and then output as reproduced sound from a speaker 53. The reproduced sound output from the speaker 53 according to the reproduction signal is collected by a microphone 54 and input as a recording signal to the audio processing device 20. The input recording signal is employed during audio processing of the sound source signal.

Figure 9:
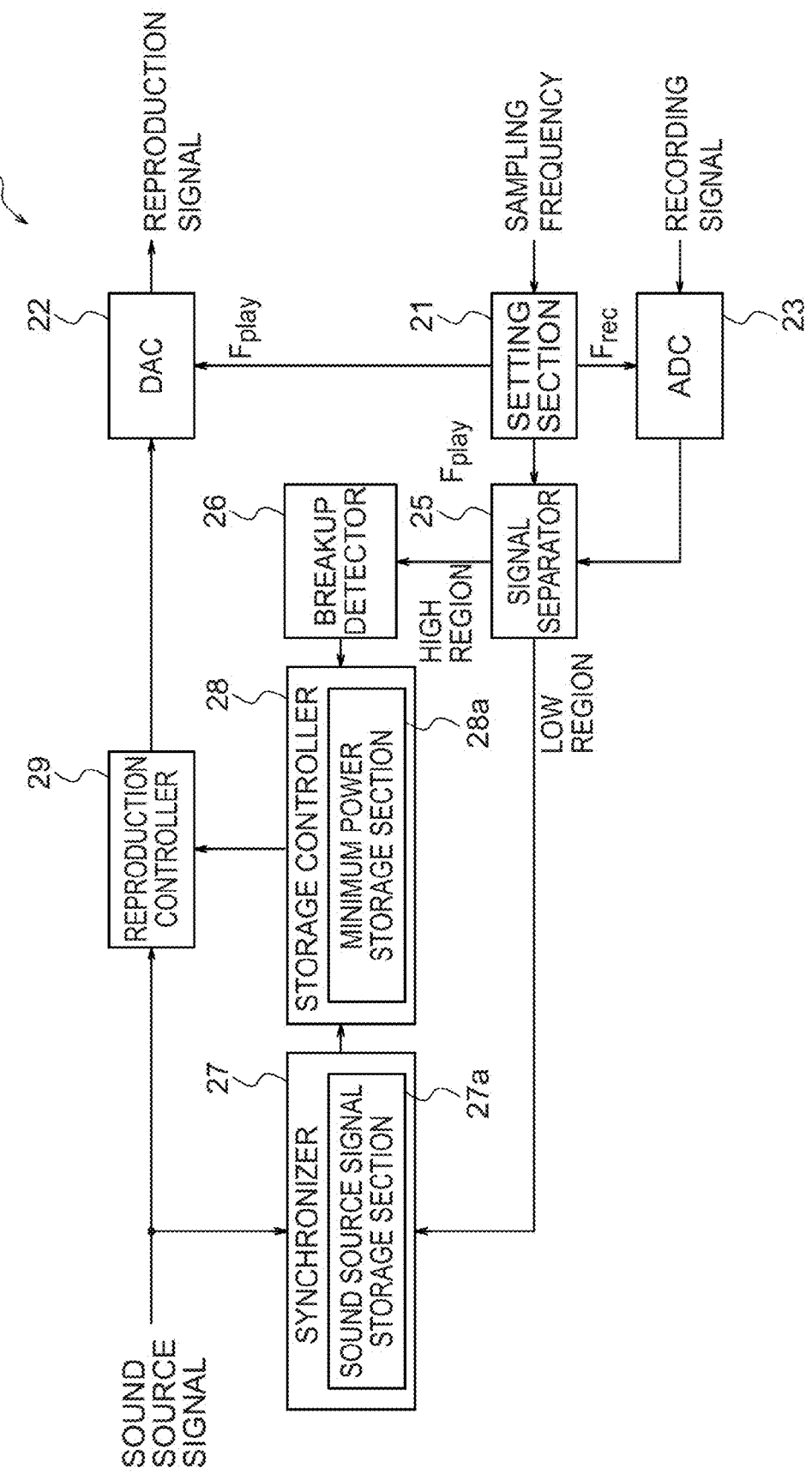
FIG. 9 is a functional block diagram illustrating an example of an audio processing device according to the second exemplary embodiment.

FIG. 9 illustrates the audio processing device 20 according to the second exemplary embodiment. The audio processing device 20 includes a setting section 21, a DAC 22, an ADC 23, a signal separator 25, a breakup detector 26, a synchronizer 27, a storage controller 28 and a reproduction controller 29. The synchronizer 27 includes a sound source signal storage section 27a, and the storage controller 28 includes a minimum power storage section 28a.

Figures 10, 11:
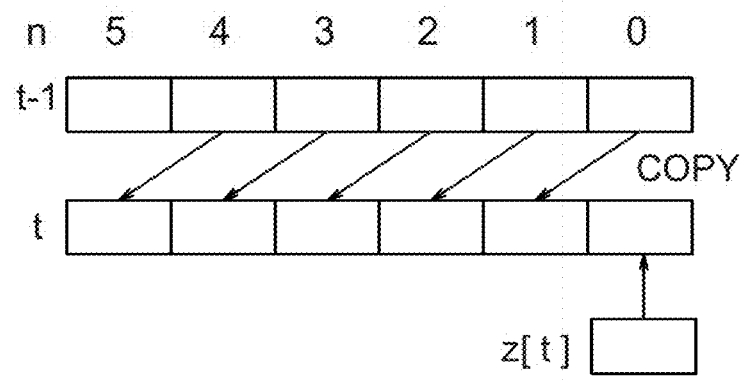
FIG. 10 is a diagram illustrating an example of a table in which selection numbers and sampling frequencies are associated with each other.
FIG. 11 is an explanatory diagram related to storage of sound source signals.

Based on an input sampling frequency Fs, the setting section 21 sets a reproduction sampling frequency $F_{play}$ in the DAC 22 and a recording sampling frequency $F_{rec}$ in the ADC 23. In the second exemplary embodiment, as illustrated in FIG. 10, configuration is made such that a selection number is input to select from a table in which selection numbers and plural sampling frequencies are associated with each other. In the example illustrated in FIG. 10, a selection number j (j=0, 1 and so on to 7) is predetermined so as to increase as the corresponding frequency increases.

Similarly to the setting section 11 of the first exemplary embodiment, in order to acquire a signal band in the reproduction signal of the reproduction band and higher the setting section 21 sets a higher recording sampling frequency $F_{rec}$ than the reproduction sampling frequency $F_{play}$. In the second exemplary embodiment, the reproduction sampling frequency $F_{play}$ and the recording sampling frequency $F_{rec}$ are set according to the following Equation (7).

$$F_{play}=Fs[j], F_{rec}=Fs[j+1] \qquad (7)$$

For example, in the example in FIG. 10, when j=1 is input as the selection number for the sampling frequency, the setting section 21 sets the reproduction sampling frequency $F_{play}$ at 11.25 kHz, and sets the recording sampling frequency $F_{rec}$ at 16 kHz.

The DAC 22 converts an output signal y[t] that is a digital signal output from the reproduction controller 29, as described later, into the reproduction signal that is an analogue signal based on the reproduction sampling frequency $F_{play}$ set by the setting section 21.

The ADC 23 converts the recording signal that is an analogue signal into an input signal x[t] that is a digital signal based on the recording sampling frequency $F_{rec}$ set by the setting section 21, and outputs the input signal x[t] to the signal separator 25.

Based on the reproduction sampling frequency $F_{play}$ set by the setting section 21, the signal separator 25 separates the input signal x[t] input from the ADC 23 into a low region signal $x_{low}[t]$ and a high region signal $x_{high}[t]$. A band separation filter (a FIR) as expressed in the following Equation (8) is employed for signal separation.

$$x_{high}[t] = \sum_{i=0}^{M-1} \alpha[i] \cdot x[t-i], \qquad (8)$$

$$x_{low}[t] = x[t] - x_{high}[t]$$

Wherein $\alpha[i]$ is a filter coefficient (HPF) of a filter i and M is the filter order. The filter is designed such that a signal in the band less than the reproduction sampling frequency $F_{play}$ is a low region signal, and a signal in the band of the reproduction sampling frequency $F_{play}$ and higher is a high region signal. The signal separator 25 generates a low region down sampling signal $r_{low}$ [t] that is the low region signal $x_{low}$ [t] down-sampled according to the reproduction sampling frequency $F_{play}$. The signal separator 25 outputs the high region signal $x_{high}$ [t] to the breakup detector 26, and outputs the low region down sampling signal $r_{low}$ [t] to the synchronizer 27.

The breakup detector 26 employs 1 frames worth of a high region signal $x_{high}$ [i]=0, 1 and so on to N−1, wherein N is the sampling point number in 1 frame) input from the signal separator 25 to compute the high region power $p_{high}$ according to the following Equation (9).

$$p_{high} = \frac{1}{N}\sum_{i=0}^{N-1}(x_{high}[i])^2 \quad (9)$$

The breakup detector 26 detects breakup based on the computed power $p_{high}$. As described above, the power of the high region is higher when breakup is present than when breakup is absent. As represented by following Equation (10), the breakup detector 26 therefore outputs a breakup detection result=1 to indicate the presence of breakup when the power $p_{high}$ is larger than the threshold value THR. However, the breakup detector 26 outputs the breakup detection result=0 to indicate the absence of breakup when the power $p_{high}$ is the threshold value THR or lower.

$$result = \begin{cases} 1 & \text{if}(p_{high} > THR) \\ 0 & \text{else} \end{cases} \quad (10)$$

The synchronizer 27 stores the input sound source signal z[t] in the sound source signal storage section 27a. As illustrated in FIG. 11, the sound source signal storage section 27a is a storage section with storage regions $z_n$ (n=0, 1 and so on to N−1, wherein N=6 in the example in FIG. 11) for each of 1 frames worth of the sound source signal z[t]. When the sound source signal z[t] of time t is stored in the sound source signal storage section 27a, the sound source signals respectively stored in each of the storage regions $z_n$ at time t−1 are copied to the respective storage regions $z_{n+1}$, and the sound source signal z[t] at time t is stored in the final storage region $z_0$. Namely, the sound source signal stored in each of the storage regions $z_n$ is z[t−n].

Moreover, the synchronizer 27 computes a delay $d_{max}$ according to the following Equation (11) to give the maximum correlation between the low region down sampling signal $r_{low}$ [t] input from the signal separator 25 and the sound source signal z[t] stored in the sound source signal storage section 27a.

$$d_{max} = \text{argmax}_d \left( \sum_{t=0}^{N-1}(r_{low}[t] \cdot z[t-d]) \right) \quad (11)$$

Moreover, the synchronizer 27 uses the computed delay $d_{max}$ to generate a sync signal k[t] corresponding to the input signal as k[t]=z[t−$d_{max}$].

As expressed by the following Equation (12), the storage controller 28 computes a power $p_{low}$ of a sound source signal in which breakup has occurred (corresponding to a low region of the input signal) from the sync signal k[t] corresponding to the input signal x[t] in which breakup is detected.

$$p_{low} = \frac{1}{N}\sum_{i=0}^{N-1}(k[i])^2 \quad (12)$$

As expressed in the following Equation (13), the storage controller 28 renews a minimum power $p_{min}$ [n] with the computed $p_{low}$ when the power $p_{low}$ is lower than the minimum power $p_{min}$ [n−1] already stored in the minimum power storage section 28a. The $p_{min}$ [n−1] is however used unmodified as the minimum power $p_{min}$ [n] when the computed $p_{low}$ is the minimum power $p_{min}$ [n−1] or greater.

$$p_{min}(n) = \begin{cases} p_{low} & \text{if}((\text{result}=1) \text{ and } (p_{low} < p_{min}[n-1])) \\ p_{min}[n-1] & \text{else} \end{cases} \quad (13)$$

The reproduction controller 29 uses 1 frames worth of the sound source signal z[i] (i=0, 1, and so on up to N−1) to compute the sound source signal power $p_{in}$, for example according to the following Equation (14).

$$p_{in} = \frac{1}{N}\sum_{i=0}^{N-1}(z[i])^2 \quad (14)$$

The minimum power $p_{min}$ stored in the minimum power storage section 28a is the minimum out sound source signal power when breakup is detected, and there is a high probability that breakup is occurring when the sound source signal power $p_{in}$ is larger than the minimum power $p_{min}$. The reproduction controller 29 therefore suppresses the sound source signal z[t] so as to lower the sound source signal power $p_{in}$ to the minimum power $p_{min}$ when the sound source signal power $p_{in}$ is larger than the minimum power $p_{min}$. For example, the reproduction controller 29 generates an output signal y[t] that is the sound source signal z[t] that has been attenuated according to the following Equation (15), and outputs the output signal y[t]. When the power $p_{in}$ of the sound source signal is the minimum power $p_{min}$ or higher the sound source signal z[t] is output unmodified as the output signal y[t].

$$y[t] = \begin{cases} z[t] \cdot \sqrt{\frac{p_{min}[n]}{p_{in}}} & \text{if}(p_{in} > p_{min}[n]) \\ z[t] & \text{else} \end{cases} \quad (15)$$

The audio processing device 20 may for example be implemented by a computer 230 as illustrated in FIG. 12. The computer 230 includes a CPU 32, a memory 34, a non-volatile storage section 36, and an input-output interface (IF) 38. The CPU 32, the memory 34, the storage section 36 and the input-output IF 38 are connected to each other through a bus 40. The speaker 53 and the microphone 54 are connected to the input-output IF 38.

The storage section 36 can be implemented for example by a HDD or flash memory. The storage section 36 serving as a storage medium is stored with an audio processing program 70 for causing the computer 230 to function as the audio processing device 20. The storage section 36 includes a sound source signal storage region 77a for storing the sound source signal, and a minimum power storage region 78a for storing the minimum power $p_{min}$. The CPU 32 reads the audio processing program 70 from the storage section 36, expands the audio processing program 70 into the memory 34, and sequentially executes processes of the audio processing program 70.

The audio processing program 70 includes a setting process 71, a DAC process 72, an ADC process 73, a signal separation process 75, a breakup detection process 76, a synchronization process 77, a storage control process 78 and an reproduction control process 79.

The CPU 32 operates as the setting section 21 illustrated in FIG. 9 by executing the setting process 71. The CPU 32 operates as the DAC 22 illustrated in FIG. 9 by executing the DAC process 72. The CPU 32 operates as the ADC 23 illustrated in FIG. 9 by executing the ADC process 73. The CPU 32 operates as the signal separator 25 illustrated in FIG. 9 by executing the signal separation process 75. The CPU 32 operates as the breakup detector 26 illustrated in FIG. 9 by executing the breakup detection process 76. The CPU 32 operates as the synchronizer 27 illustrated in FIG. 9 by executing the synchronization process 77. The CPU 32 operates as the storage controller 28 illustrated in FIG. 9 by executing the storage control process 78. The CPU 32 operates as the reproduction controller 29 illustrated in FIG. 9 by executing the reproduction control process 79.

When the audio processing device 20 is implemented with the computer 230, the sound source signal storage region 77a is employed as the sound source signal storage section 27a illustrated in FIG. 9, and the minimum power storage region 78a is employed as the minimum power storage section 28a illustrated in FIG. 9. The computer 230 executing the audio processing program 70 accordingly functions as the audio processing device 20.

Note that it is possible to implement the audio processing device 20 with, for example, a semiconductor integrated circuit, and more particularly with an ASIC or the like.

Explanation next follows regarding operation of the second exemplary embodiment. When sound source signal reproduction processing is started in the mobile phone 50, the CPU 32 first expands the audio processing program 70 stored in the storage section 36 into the memory 34 and then executes the audio processing illustrated in FIG. 13.

At step 200 of the audio processing illustrated in FIG. 13, the setting section 21 sets the reproduction sampling frequency $F_{play}$ in the DAC 22 and the recording sampling frequency $F_{rec}$ in the ADC 23 based on an input sampling frequency selection number j. The setting section 21, for example with reference to the table of the selection numbers and the sampling frequencies associated with each other as illustrated in FIG. 10, sets the reproduction sampling frequency $F_{play}$ and the recording sampling frequency $F_{rec}$ such that the $F_{play} < F_{rec}$, as expressed by Equation (7).

Then at step 202, the synchronizer 27 copies the sound source signals stored in each of the storage regions $z_n$ of the sound source signal storage section 27a to respective storage regions $z_{n+1}$ and stores the sound source signal z[t] in the final storage region $z_0$.

Then at step 204, the reproduction controller 29 employs 1 frames worth of the sound source signal z[i] (i=0, 1 and so on to N−1) to compute the sound source signal power $p_{in}$. Then the reproduction controller 29 determines whether or not the computed power $p_{in}$ of the sound source signal is greater than the minimum power $p_{min}$. Processing proceeds to step 206 when $p_{in} > p_{min}$, and the reproduction controller 29 generates an output signal y[t] of the attenuated sound source signal z[t] in which the power $p_{in}$ of the sound source signal has been lowered to the minimum power $p_{min}$, and outputs the output signal y[t]. However, the reproduction controller 29 outputs the sound source signal z[t] unmodified as the output signal y[t] when $p_{in} \leq p_{min}$.

Then at step 210, based on the reproduction sampling frequency $F_{play}$ set at step 200, the DAC 22 converts the output signal y[t] that is the digital signal output at step 206 or step 208 into the reproduction signal that is an analogue signal. The output reproduction signal is output from the speaker 53 as reproduced sound.

Then at step 212, the ADC 23 acquires the recording signal collected by the microphone 54. Then based on the recording sampling frequency $F_{rec}$ set at step 200, the ADC 23 converts the recording signal that is an analogue signal into the input signal x[t] that is a digital signal.

Then at step 214, based on the reproduction sampling frequency $F_{play}$ set at step 200, the signal separator 25 separates the input signal x[t] that was converted at step 212 into a low region signal $x_{low}$ [t] and a high region signal $x_{high}$ [t]. The signal separator 25 also generates a low region down sampling signal $r_{low}$ [t] of the low region signal $x_{low}$ [t] down-sampled corresponding to the reproduction sampling frequency $F_{play}$.

Then at step 216, the synchronizer 27 computes the delay $d_{max}$ that is the highest correlation between the low region down sampling signal $r_{low}$ [t] generated at step 214 and the sound source signal z[t] stored in the sound source signal storage section 27a. The synchronizer 27 then uses the computed delay $d_{max}$ to generate a sync signal k[t] corresponding to the input signal, $k[t]=z[t-d_{max}]$.

Then at step 218, the breakup detector 26 uses 1 frames worth of the high region signal $x_{high}$ [i] (i=0, 1, and so on to N−1) separated at step 214 to compute a high region power $p_{high}$. Then when the computed power $p_{high}$ is greater than a predetermined threshold value THR, the breakup detector 26 outputs a breakup detection result=1 to indicate the presence of breakup. However, the breakup detector 26 outputs the breakup detection result=0 to indicate the absence of breakup when the power $p_{high}$ is the threshold value THR or lower.

Then at step 220, the storage controller 28 determines whether or not the breakup detection result output at step 218 is 1. Processing proceeds to step 222 when the result=1, and processing proceeds to step 228 when the result=0.

At step 222, the storage controller 28 computes a power $p_{low}$ of the sound source signal when breakup has occurred from the sync signal k[t] corresponding to the breakup detected input signal x[t]. The storage controller 28 then determines whether or not the computed power $p_{low}$ is smaller than the minimum power $p_{min}$ [n−1] already stored in the minimum power storage section 28a. Processing proceeds to step 224 when $p_{low} < P_{min}$ [n−1], and the storage controller 28 renews the minimum power $p_{min}$ [n] with $p_{low}$. However processing proceeds to step 226 when $p_{low} \geq p_{min}$ [n−1], and $p_{min}$ [n−1] is used unmodified as minimum power $p_{min}$ [n].

Then at step 228 determination is made as to whether or not a following sound source signal exists. A following sound source signal exists when reproduction processing of the mobile phone 50 continues, and so processing returns to step 202, and the processing of steps 202 to 226 is repeated. However, no following sound source signal exists when the reproduction processing has finished and so the audio processing is ended.

As explained above, according to the audio processing device 20 of the second exemplary embodiment, during reproduction of a sound source signal using a mobile phone, a recording signal collected by the microphone is converted into an input signal using a higher recording sampling frequency than the reproduction sampling frequency when reproducing the sound source signal. Then breakup in the input signal is detected based on the power of a high region of the reproduction sampling frequency and higher. The minimum power is stored of the sound source signal for synchronization to the input signal when breakup is detected, and the sound source signal is attenuated before reproduction when the power of the sound source signal is greater than the minimum power. Consequently, breakup can be detected during reproduction of a sound source signal without the need for prior calibration using a test signal.

Note that the breakup detection method of the first exemplary embodiment may be applied to the second exemplary embodiment, and the breakup detection method of the second exemplary embodiment may be applied to the first exemplary embodiment. Namely, breakup detection may be performed in the second exemplary embodiment based on a ratio between the low region spectrum and the high region spectrum. Or, breakup detection may be performed in the first exemplary embodiment based on the power of the high region signal.

Although explanation has been given in the first exemplary embodiment of a case in which breakup detection is performed based on the difference between power of the entire low region spectrum and power of the entire high region spectrum, there is no limitation thereto. Breakup detection may be performed based on a difference between the power of a signal of a portion contained in the low region and a signal of a portion contained in the high region. Moreover, there is no limitation to a difference between the power of a low region signal and the power of a high region signal, and breakup detection may be performed based on a ratio between the power of a low region signal and the power of a high region signal. Moreover, although explanation has been given in the second exemplary embodiment of a case in which breakup detection is performed based on power of the entire high region there is no limitation thereto. Breakup detection may be performed based on the power of a signal of a portion contained in the high region.

Moreover, explanation has been given above of a mode in which the audio processing programs 60 and 70 that are examples of an audio processing program of technology disclosed herein are pre-stored (installed) as programs on the storage section 36. However, the audio processing program of technology disclosed herein may be provided in a format recorded on a recording medium such as a CD-ROM or DVD-ROM.

An aspect of technology disclosed herein exhibits the advantageous effect of enabling breakup to be detected during reproduction without needing to perform calibration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An audio processing device comprising:
   a processor configured to execute a process, the process comprising;
   setting a reproduction sampling frequency and a recording sampling frequency higher than the reproduction sampling frequency;
   based on the reproduction sampling frequency, converting a sound source signal that is a digital signal into a reproduction signal that is an analogue signal;
   based on the recording sampling frequency, converting a recording signal that is an analogue signal obtained by recording sound that has been reproduced according to the reproduction signal converted into an input signal that is a digital signal;
   separating the input signal converted into a low region signal contained in a band of less than the reproduction sampling frequency and a high region signal contained in a band of the reproduction sampling frequency and higher; and
   detecting whether or not breakup is occurring in the reproduced sound based on power of the high region signal, or based on a difference or ratio between power of the high region signal and power of the low region signal.

2. The audio processing device of claim 1, wherein the recording sampling frequency is set at twice the reproduction sampling frequency.

3. The audio processing device of claim 1, wherein breakup is detected as occurring in the reproduced sound when the power of the high region signal is greater than a predetermined first threshold value, or when a difference or a ratio between the power of the high region signal and the power of the low region signal is smaller than a predetermined second threshold value.

4. The audio processing device of claim 1, wherein the process further comprises:
   storing a specific time period worth of a sound source signal prior to converting to the reproduction signal, and then, based on a correlation between the stored sound source signal and the input signal, synchronizes the stored sound source signal and the input signal;
   storing power of the stored sound source signal for synchronizing to an input signal when breakup is detected by the breakup detector; and
   when power of a sound source signal prior to converting to the reproduction signal is greater than the power of the stored sound source signal, controlling the sound source signal prior to converting to the reproduction signal such that breakup does not occur.

5. The audio processing device of claim 4, wherein the process further comprises:
   attenuating the sound source signal prior to converting to the reproduction signal such that the power of the sound source signal prior to converting to the reproduction signal is the power of the stored sound source signal or lower.

6. The audio processing device of claim 1, wherein the process further comprises:
   suppressing that suppresses the low region signal when breakup is detected by the breakup detector.

7. The audio processing device of claim 6, wherein the process further comprises:
   estimating a breakup signal that is a low region signal containing a breakup component corresponding to the high region signal in which breakup has been detected by the breakup detector,
   wherein the low region signal is suppressed by multiplying the low region signal by a gain that is larger the smaller the difference is between the estimated breakup signal and the separated low region signal.

8. An audio processing method comprising:
- setting a reproduction sampling frequency and a recording sampling frequency higher than the reproduction sampling frequency;
- based on the reproduction sampling frequency, converting a sound source signal that is a digital signal into a reproduction signal that is an analogue signal;
- based on the recording sampling frequency, converting a recording signal that is an analogue signal obtained by recording sound that has been reproduced according to the converted reproduction signal into an input signal that is a digital signal;
- separating the converted input signal into a low region signal contained in a band of less than the reproduction sampling frequency and a high region signal contained in a band of the reproduction sampling frequency and higher; and
- detecting whether or not breakup is occurring in the reproduced sound based on power of the high region signal, or based on a difference or ratio between power of the high region signal and power of the low region signal.

9. The audio processing method of claim 8, wherein the recording sampling frequency is set at twice the reproduction sampling frequency.

10. The audio processing method of claim 8, wherein breakup is detected as occurring in the reproduced sound when the power of the high region signal is greater than a predetermined first threshold value, or when a difference or a ratio between the power of the high region signal and the power of the low region signal is smaller than a predetermined second threshold value.

11. The audio processing method of claim 8, further comprising:
- storing a specific time period worth of a sound source signal prior to converting to the reproduction signal, and then synchronizing the stored sound source signal and the input signal based on a correlation between the stored sound source signal and the input signal;
- storing power of the stored sound source signal for synchronizing to an input signal when breakup is detected; and
- when power of a sound source signal prior to converting to the reproduction signal is greater than the power of the stored sound source signal, controlling the sound source signal prior to converting to the reproduction signal such that breakup does not occur.

12. The audio processing method of claim 11, wherein the sound source signal prior to converting to the reproduction signal is attenuated such that the power of the sound source signal prior to converting to the reproduction signal is the power of the stored sound source signal or lower.

13. The audio processing method of claim 8, further comprising suppressing the low region signal when breakup is detected.

14. The audio processing method of claim 13, further comprising:
- estimating a breakup signal that is a low region signal containing a breakup component corresponding to the high region signal in which breakup has been detected, wherein the low region signal is suppressed by multiplying the low region signal by a gain that is larger the smaller the difference is between the estimated breakup signal and the separated low region signal.

15. A non-transitory recording medium having recorded thereon an audio processing program for causing a computer to execute a process, the process comprising:
- setting a reproduction sampling frequency and a recording sampling frequency higher than the reproduction sampling frequency;
- based on the reproduction sampling frequency, converting a sound source signal that is a digital signal into a reproduction signal that is an analogue signal;
- based on the recording sampling frequency, converting a recording signal that is an analogue signal obtained by recording sound that has been reproduced according to the converted reproduction signal into an input signal that is a digital signal;
- separating the converted input signal into a low region signal contained in a band of less than the reproduction sampling frequency and a high region signal contained in a band of the reproduction sampling frequency and higher; and
- detecting whether or not breakup is occurring in the reproduced sound based on power of the high region signal, or based on a difference or ratio between power of the high region signal and power of the low region signal.

16. The non-transitory recording medium having recorded thereon an audio processing program of claim 15, wherein the recording sampling frequency is set at twice the reproduction sampling frequency.

17. The non-transitory recording medium having recorded thereon an audio processing program of claim 15, wherein breakup is detected as occurring in the reproduced sound when the power of the high region signal is greater than a predetermined first threshold value, or when a difference or a ratio between the power of the high region signal and the power of the low region signal is smaller than a predetermined second threshold value.

18. The non-transitory recording medium having recorded thereon an audio processing program of claim 15, wherein the process further comprises:
- storing a specific time period worth of a sound source signal prior to converting to the reproduction signal, and then synchronizing the stored sound source signal and the input signal based on a correlation between the stored sound source signal and the input signal;
- storing power of the stored sound source signal for synchronizing to an input signal when breakup is detected; and
- when power of a sound source signal prior to converting to the reproduction signal is greater than the power of the stored sound source signal, controlling the sound source signal prior to converting to the reproduction signal such that breakup does not occur.

19. The non-transitory recording medium having recorded thereon an audio processing program of claim 18, wherein the sound source signal prior to converting to the reproduction signal is attenuated such that the power of the sound source signal prior to converting to the reproduction signal is the power of the stored sound source signal or lower.

20. The non-transitory recording medium having recorded thereon an audio processing program of claim 15, wherein the process further comprises suppressing the low region signal when breakup is detected.

21. The non-transitory recording medium having recorded thereon an audio processing program of claim 20, wherein the process further comprises:

estimating a breakup signal that is a low region signal containing a breakup component corresponding to the high region signal in which breakup has been detected, wherein the low region signal is suppressed by multiplying the low region signal by a gain that is larger the smaller the difference is between the estimated breakup signal and the separated low region signal.

* * * * *